(12) United States Patent
Shekar et al.

(10) Patent No.: US 6,433,564 B1
(45) Date of Patent: Aug. 13, 2002

(54) BGA DEVICE POSITIONER KIT

(75) Inventors: B. S. Chandra Shekar; Liop-Jin Yap; Chee-Keong Tan, all of Singapore (SG)

(73) Assignee: St Assemby Test Services Pte. Ltd, Singapore (SG)

( * ) Notice: Subject to any disclaimer, the term of this patent is extended or adjusted under 35 U.S.C. 154(b) by 0 days.

(21) Appl. No.: 09/332,380

(22) Filed: Jun. 14, 1999

(51) Int. Cl.⁷ ............................................... G01R 31/02
(52) U.S. Cl. ........................ 324/755; 324/758; 324/760
(58) Field of Search ................................. 324/755, 754, 324/758, 760, 765

(56) References Cited

U.S. PATENT DOCUMENTS

| | | | | |
|---|---|---|---|---|
| 5,172,049 A | * | 12/1992 | Kiyokawa et al. | 324/760 |
| 5,475,317 A |   | 12/1995 | Smith | 324/760 |
| 5,500,605 A | * | 3/1996 | Chang | 324/758 |
| 5,523,696 A | * | 6/1996 | Charlton et al. | 324/758 |
| 5,730,606 A |   | 3/1998 | Sinclair | 439/70 |
| 5,731,709 A |   | 3/1998 | Pastore et al. | 324/760 |
| 5,746,608 A |   | 5/1998 | Taylor | 439/70 |
| 5,766,021 A |   | 6/1998 | Pickles et al. | 439/70 |
| 5,955,888 A | * | 9/1999 | Fredrickson et al. | 324/761 |
| 6,064,217 A | * | 5/2000 | Smith | 324/760 |

* cited by examiner

*Primary Examiner*—N. Le
*Assistant Examiner*—Anjan K. Deb
(74) *Attorney, Agent, or Firm*—George O. Saile; Stephen B. Ackerman

(57) ABSTRACT

An apparatus was described which allows accurate and fast positioning of device kits for the input shuttle, the output shuttle, the docking plates, hot plate and testing stations within the semiconductor device manufacturing and testing applications for Ball Grid Array sockets. A method was highlighted by means of which the sockets in these shuttles and plates can be adapted to different sizes and different types of semiconductor devices. A pick up shaft described resulted in added flexibility within the semiconductor device manufacturing and testing environment.

5 Claims, 17 Drawing Sheets

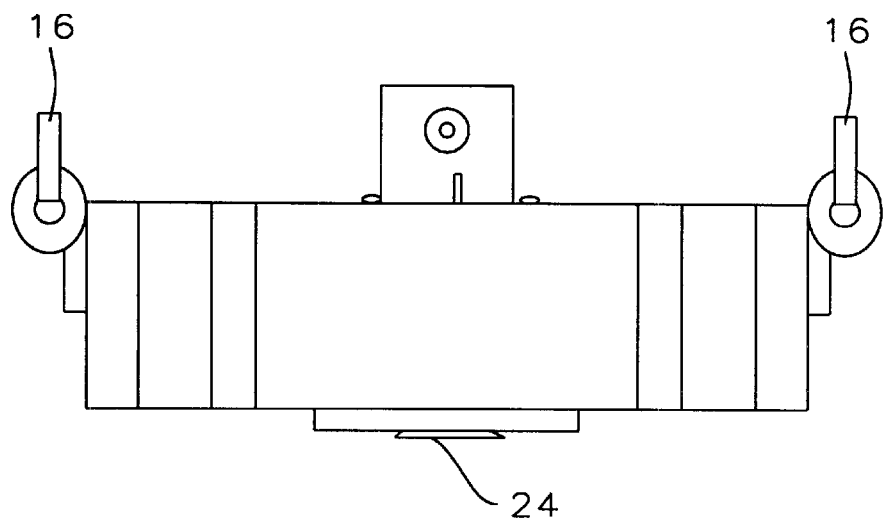
*FIG. 2a – Prior Art*
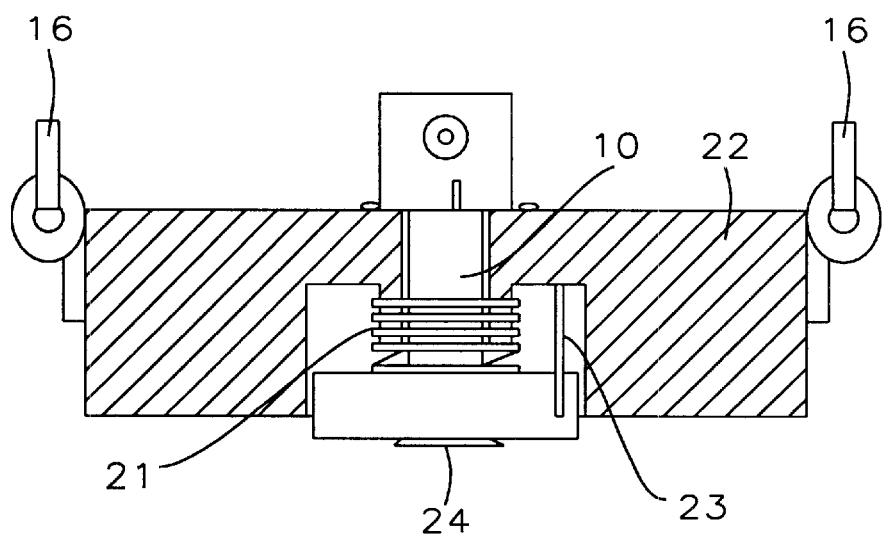
*FIG. 2b – Prior Art*

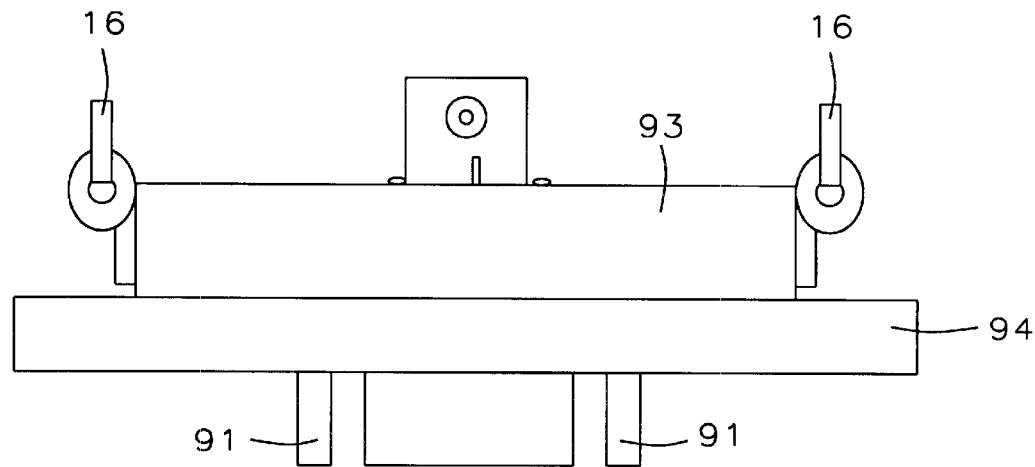
FIG. 9a – Prior Art
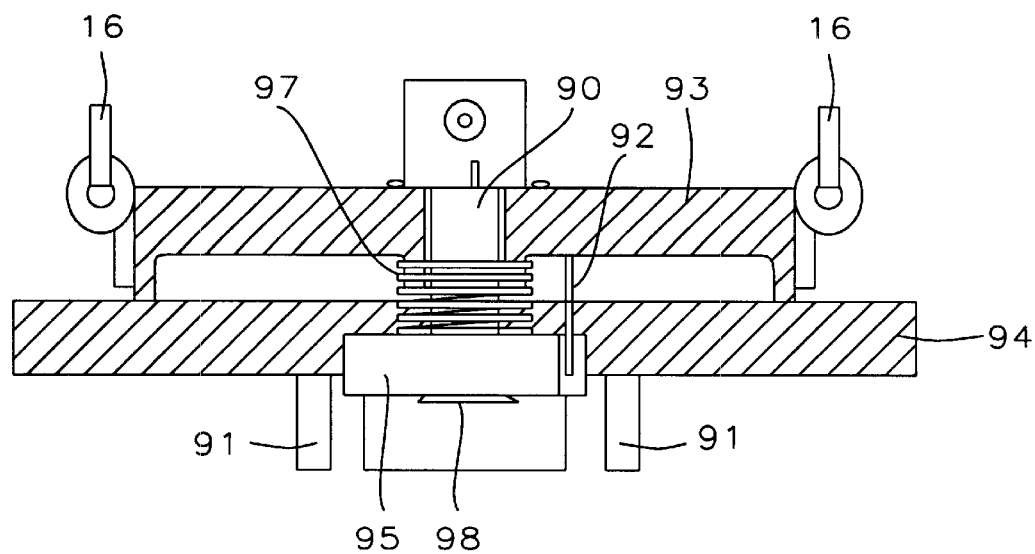
FIG. 9b – Prior Art

BGA DEVICE POSITIONER KIT

FIELD OF THE INVENTION

The invention relates to the testing of semiconductor devices, and more specifically to a method of transporting and positioning of Ball Grid Array (BGA) semiconductor devices during device transportation and testing.

DESCRIPTION OF PRIOR ART

The present invention relates to a universal production Ball Grid Array (BGA) socket for establishing solder less contact between the conductive balls of a ball grid array package and the sockets for transporting or testing of BGA semiconductor devices.

There presently exist several methods for packaging semiconductor devices. One popular type of semiconductor packaging is referred to as Quad Flat Pack (QFP), which is a type of peripheral lead package. Another type of packaging technology is referred to as Ball Grid Array (BGA) packaging where conductive ball leads are placed over the entire surface of a chip instead of only around the edges of the chip.

A BGA package includes a plastic or ceramic carrier containing a semiconductor circuit chip and having a plurality of spaced apart contact balls arranged over the bottom face of the carrier or substrate. This plurality of balls is adopted to make electrical connections with a printed circuit board or with other BGA chip or semiconductor component mounting surfaces. This allows for more leads to be placed in a given package size and for tolerances which are looser than peripheral lead type tolerances.

One manufacturing process which can lead to ball deformation is that of testing and particularly testing at high temperatures. After a semiconductor device has been fabricated it undergoes a variety of tests to ensure its functionality and reliability before it is shipped to the customer. If testing is performed at elevated temperatures, contact ball deformation becomes more likely.

Once the testing has been completed and the device returns to ambient temperatures, indentations in the balls due to the pressure exerted thereon may remain.

From the foregoing it is clear that BGA techniques require that the contacting balls are placed adhering to reasonable tolerances, that the pressure exerted while making contact is not excessive and that making the contacts is relatively easy, that is the BGA semiconductor device carrier has some freedom of motion in the plane of contact.

FIGS. 2a and 2b show the Prior Art device input arm kit, both in side view and a cross sectional view. Spring 21 exerts downward pressure on pick-up shaft 10 for better contact with the target socket. The head 24 of the pick up shaft 10 does not have chamfered sides and does therefore not assist in orienting the device kit properly with respect to. the target socket. There is also no provision which allows motion of the pick-up shaft 10 with respect to the target socket independent of the top plate or body 22 of the input arm assembly. This means that for any movement or orientation of the input arm assembly with respect to the target socket the entire assembly repositions itself including the pick up shaft 10. The BGA device (not shown) is attached for transportation to the head 24 of the pick up shaft 10 by means of vacuum suction, the vacuum is provided through a channel which runs through the center of the pitch up shaft 10 (not shown).

Stabilizing pin 23 is used for dampening any motion which might occur between the pick up shaft 10 and the body of the kit 22. Clips 16 are provided for manual handling of the input arm kit. The input arm is used for all movement of BGA devices (such as to the hot plate and the input shuttle) except for the testing and output positions. The test arm assembly is different from the input arm assembly, the Prior Art test arm assembly is described in detail under FIGS. 9a and 9b following.

FIGS. 9a and 9b show the Prior Art BGA device test arm kit together with a cross section of this kit. This assembly is similar to the previously described Prior Art device kit, FIGS. 2a and 2b. The main difference between the Prior Art input arm assembly (FIGS. 2a and 2b) and the test arm assembly (FIGS. 9a and 9b) is that the test arm assembly has a top plate 93 and a self guided rest piece where the body of the input arm assembly (FIGS. 2a and 2b) consists of one plate. The pick up shaft 90, FIGS. 9b, protrudes through the top plate 93. A stabilizer pin 92 is provided to dampen any motion which might occur between the pick up shaft 90 and plate 93 of the test assembly arm. A spring 97 of proper tension is provided to press or urge the head 98 of the pick up shaft 90 into the socket of the target plate or shuttle. Clips 16 are provided for manual handling of the test arm kit.

U.S. Pat. No. 5,766,021 (Pickles et al.) shows a reusable socket for making electrical connection between a BGA type package and a test fixture.

U.S. Pat. No. 5,730,606 (Sinclair) shows a universal production BGA socket for mounting the BGA on a circuit board.

U.S. Pat. No. 5,731,709 (Pastore et al.) shows a device for testing BGA.

U.S. Pat. No. 5,746,608 (Taylor) shows a surface mount socket for an electronic package.

SUMMARY OF THE INVENTION

It is the objective of the present invention to provide for highly accurate and dependable movement of semiconductor devices within the semiconductor device manufacturing and testing environments.

It is a further objective of the present invention to increase the product handling capability within the semiconductor manufacturing and testing environments by increasing the number, type and size of semiconductor devices that can be transported.

As shown in cross section in FIG. 5, a semiconductor device 52 having a semiconductor device mounting support 54 with a periphery 51, a plurality of conductive vias 53' formed in the semiconductor device mounting support 54, a semiconductor die 52 mounted on the semiconductor device mounting support 54 and electrically coupled to the plurality of conductive vias, a plurality of conductive balls 53 attached to the semiconductor device mounting support 54 and electrically coupled to the semiconductor die 52 through the plurality of conductive vias 53'. FIG. 7 shows an input pocket 72 for receiving the semiconductor device and having a plurality of semi-circular holes 71 so that the semiconductor device 52 can be placed into the input pocket 72 such that the plurality of semi-circular holes 71 of the input pocket is providing proper positioning to the plurality of conductive balls 53 that is attached to the semiconductor device mounting support.

It is a further objective of the present invention to allow implementation of the present invention without having any impact on semiconductor manufacturing or testing apparatus other than the positioning kit which is the subject of the present invention.

According to the present invention, a plate is added to the kit which is used to position the BGA semiconductor device. The BGA kit guides or positions the BGA device into position for testing and other required processing operations such as device burn-in. The kit guides the BGA device into a device pocket in the target plate. The plate which has been added to the BGA device kit is placed on ball bearings to allow ease of movement in a direction which is lateral or perpendicular to the direction of the movement of insertion of the input arm or the test arm into the target socket. Misalignment between the input arm (when inserting a BGA device kit into a BGA device target pocket for testing, burn-in, etc.) or a BGA test arm (during testing of a BGA semiconductor device) and the target socket can in this manner be compensated for.

A BGA device handling apparatus is used for positioning BGA semiconductor devices within the following fixtures:

hot plates where the temperature of the BGA device can be controlled over an extended period of time for such purposes as device burn-in, reliability testing, aging, etc.; BGA semiconductor devices are placed or loaded into the hot plates by means of an input arm.

input shuttle which allows for a multiplicity of BGA devices to be entered into a particular station for further operations of testing or manufacturing; BGA semiconductor devices are placed or loaded into the input shuttle by means of an input arm.

output shuttle which removes a multiplicity of BGA devices from a testing or manufacturing station; BGA semiconductor devices are placed or loaded into the output shuttle by means of an output arm which is of the same design as the output arm.

docking plate which allows a multiplicity of BGA devices to be retained for an extended period of time due to a interruption in their testing or manufacturing sequence; BGA semiconductor devices are placed or loaded into the docking plate by means of an test arm which provides proper guidance of the socket to the handler.

testing plate, BGA semiconductor devices are placed or loaded into the testing station by means of the test arm.

The above described shuttles and plates into which the BGA device is inserted or positioned are for the purpose of the present invention referred to as target plates. The sockets within the target plates into which the BGA device is inserted is for the purpose of the present invention referred to as target sockets.

From the above enumeration it is clear that for BGA device testing and manufacturing operations different BGA semiconductor device handling assemblies are used, that is the input test arm, the socket and the docking plate. The input arm positions the input kit with respect to the target plate, the test arm positions the BGA device kit with respect to the test plate. These two or more assemblies, that is the input kit and the test kit, are addressed as embodiments within the scope of the present invention.

In addition, the prior art single guide pin is being replaced by two guide pins mounted on the plate and placed on ball bearings which results in more accurate and dependable positioning of the BGA device kit.

Also, according to the present invention, increased flexibility in transporting and handling of BGA chip carriers is accomplished by modifying the head of the pick-up shaft of the BGA device kit which moves the BGA device between different positions. The input arm moves the BGA device kit to and from the hot plate and the input shuttle. The input arm can further be used for any other required movement of the device. The test arm moves the BGA device kit to the test socket of the BGA test plate. This increased flexibility in transporting or positioning a device under the present invention is required to assure that a plurality of device sizes and types does not have a negative effect on manufacturing throughput and consequently on overall BGA device cost.

Modification of the Prior Art and presently used BGA device positioning kits in accordance with the present invention does not impose any requirements on other existing equipment in the BGA device manufacturing and testing environment.

BRIEF DESCRIPTION OF THE DRAWINGS

FIGS. 2a and 2b show the Prior Art input arm assembly.

FIGS. 9a and 9b show the Prior Art test arm assembly.

FIG. 17a shows a plan view of the top surface of a docking plate with a large opening for mounting a BGA device for electrical testing and two smaller openings which function as device buffers, FIG. 17b shows the rear view of the docking plate as shows in FIG. 17a, FIG. 17c shows a plan view of a socket design where the socket is designed such that the insertion of the BGA device into the socket is guided by chamfered sides of the socket, FIG. 17d shows a cross sectional view of the socket of FIG. 17c.

DETAILED DESCRIPTION OF THE INVENTION

Figure 1A:
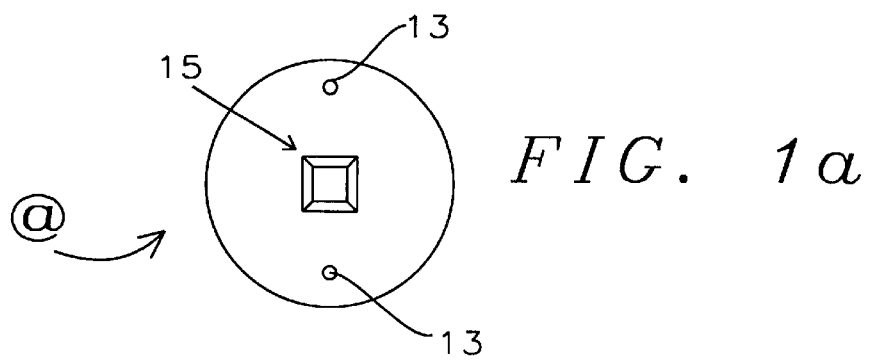
FIGS. 1a and 1b show an exploded perspective view, partially in section, of a plan view of the pick up shaft (FIG. 1a) together with the input arm assembly of the present invention (FIG. 1b).
Figure 1B:
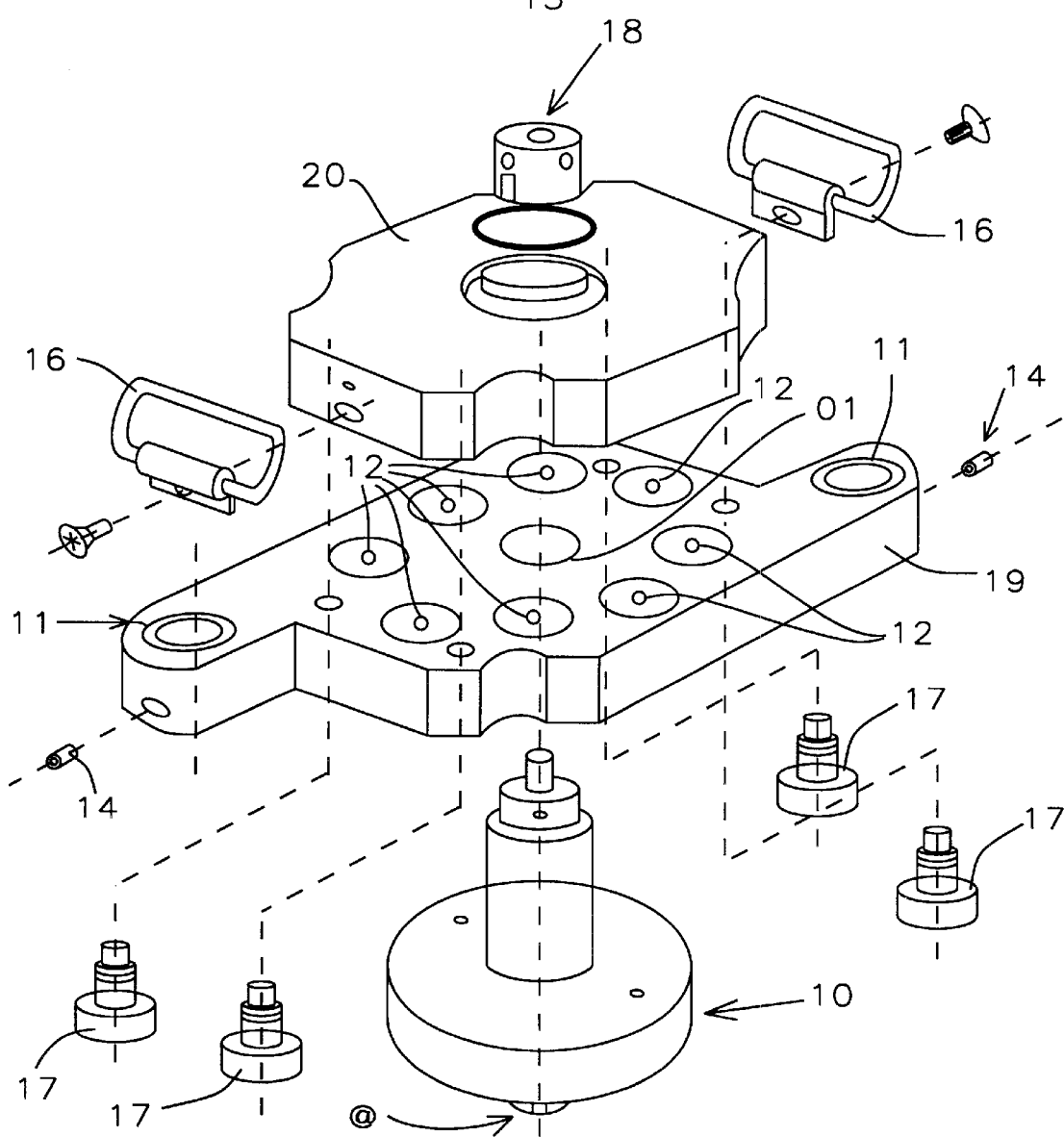

Referring now more specifically to FIGS. 1a and 1b, there are shown the main components of the BGA device input kit, that is the bottom plate 19, the top plate 20, the pick up shaft 10 and the ball bearings 12. The pick up shaft 10 is at the center of the input arm assembly. The pick up shaft 10 is mounted in the top plate by means of a shaft stopper 18. Ball bearings 12 are provided in a circular mounting around the opening 01 through which the pick up shaft 10 penetrates the upper and the lower plates 19 and 20 respectively. These ball bearings 12 are the key to the present invention since they allow movement between the two plates 19 and 20 with respect to each other and in the plane or direction of these planes. Four guide pins or screws 17 are used to maintain the relative positioning between the lower plate 19 and the upper plate 20. The lower section of these four screws 17 is threaded and screwed into the lower plate 19. The upper section of the four screws are tapered, these upper sections of the four screws 17 protrude through the lower plate and penetrate openings provided for this purpose in the upper plate 20. Due to the tapering of the four screws 17, the upper plate 20 has freedom of movement in the X-Y direction with respect to the lower plate 19.

The bottom plate 19 is positioned onto the target plate by means of the guide bushings 11, set screws 14 assure that there is no movement between the guide bushing 11 and the bottom plate 19 after the set screws have been tightened. Clips 16 are provided for manual handling of the BGA device kit.

Figure 3A:
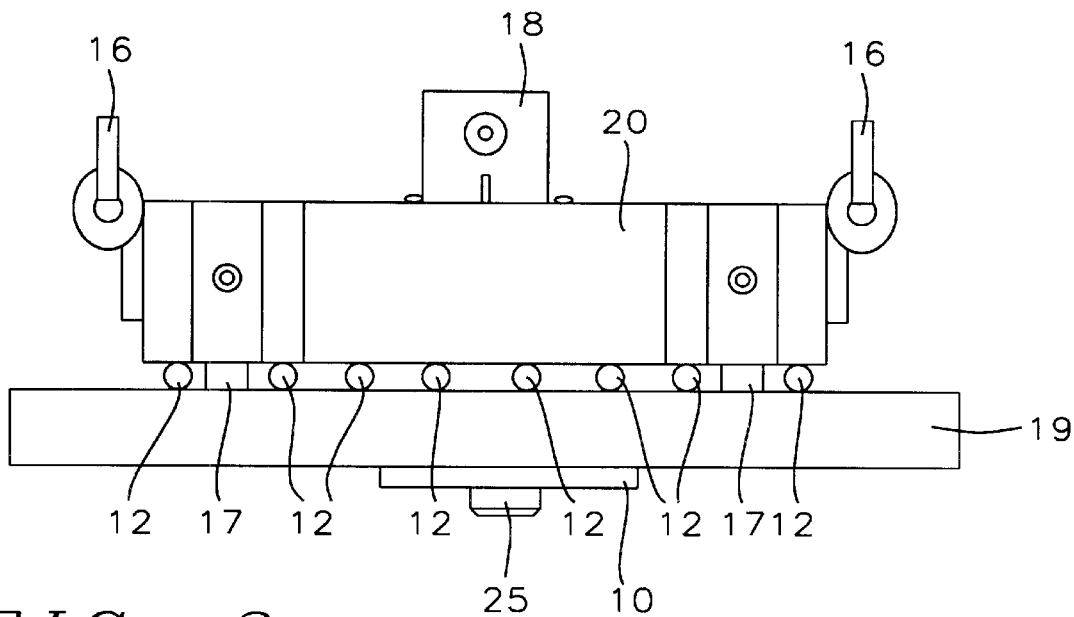
FIGS. 3a and 3b show a side view and a cross sectional view of the positioning kit of the present invention.

The BGA device (not shown) is carried by the lower surface 15 (FIG. 1a) of the pick up shaft 10 by means of a vacuum suck which is provided through a vacuum channel (not shown) running through the center of the pick up shaft 10. Further details of the construct and operation of the BGA device transportation kit are provided in the following description of FIG. 3a and 3b.

It is clear that, even though the BGA device which is carried by the lower surface 15 (FIG. 1a) is not shown in Figs. 1a and 1b, this BGA device is typically, in accordance with current practice in the semiconductor art, a semiconductor device which is mounted on a substrate which has a periphery, while a plurality of conductive vias have been formed in the substrate. The BGA die is mounted on the substrate and electrically coupled to the plurality of conductive vias while a plurality of conductive balls is attached to the substrate and electrically coupled to the semiconductor die through the plurality of conductive vias.

Figure 3B:
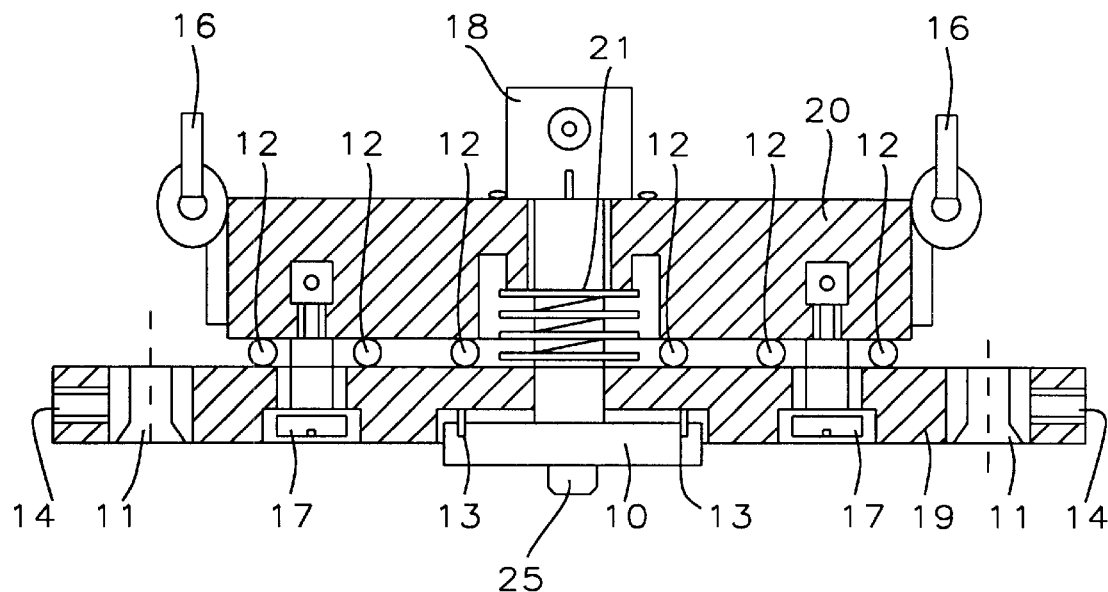
Figure 4A:
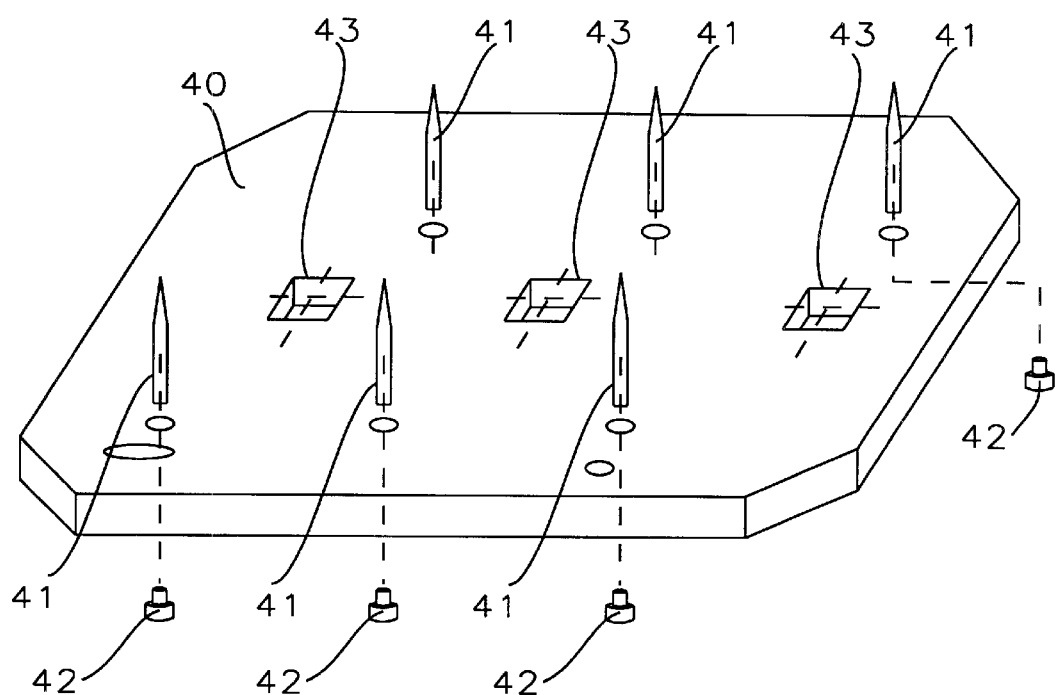
FIGS. 4a through 4d show a perspective view of the input shuttle plate with three possible designs for the chamfered pockets in the shuttle plate.
Figure 4B:
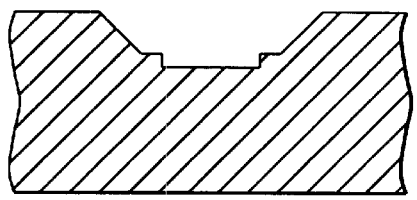
Figure 4C:
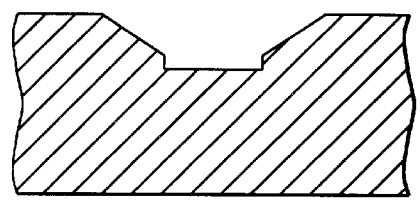
Figure 4D:
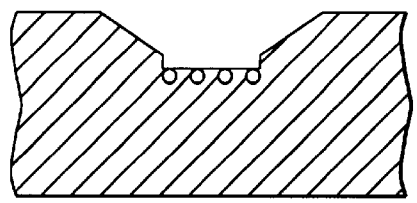

FIG. 3b a spring 21 mounted around the pick up shaft 10. This spring 21 exerts pressure on the pick up shaft 10 in a downward or Z-axis direction which is the direction of the target socket. The chamfered sides of the lower surface 25 of the pick up shaft 10 will provide easy entrance to the target pocket which is mounted in the surface of a target plate (hot plate, output or input shuttle, docking plate, further referred to as target plates or target surfaces) where the BGA device is to be positioned. The sides of the lower surface 25 of the pick up shaft 10 are shown as chamfered, these sides do not, within the scope of the present invention, have to be chamfered. When the BGA device handler arm positions the BGA device above and into the docking plate with the target socket, the bottom plate 19 will align the pick up shaft 10 with the target socket further urged by the action of spring 21. It is clear from this that the positioning of the pick up shaft 10 is only accurate if the center of the pick up shaft 10 is located exactly above the geometric center of the pocket in the target plate. The present invention addresses and eliminates any negative effects in pick up shaft alignment that may result if this alignment is not accurate or if slight variations in the alignment occur during the time that the device and the device input arm assembly are positioned above the target plate for operational purposes. Any misalignment that the top plate 20 of the BGA device kit has with the position of the aligned pick up shaft 10 (aligned with the target socket) will be accommodated by adjustment in the relative position between the top plate 20 and the bottom plate 19 which is made possible by the ball bearings 12. The top plate 20 is held to the bottom plate 19 by means of the guiding pins 17, which have a threaded lower end that is screwed to the top plate 20.

FIGS. 4a through 4d shows a perspective view of the input shuttle, together with the cross sections of three possible pocket designs. As part of the present invention the pockets for the input shuttle need to be redesigned, this redesign can be done in one of the three methods shown in FIGS. 4a through 4d. This redesign will further enhance the positioning of the device within the pocket. The cross sections for the three possible designs are shown in FIGS. 4a through 4d. These three cross sections are further detailed in the following three figures, that is FIGS. 5 through 7. The input shuttle design is, other than the redesign of the pockets, not affected. Guide pins 41 are secured in the input shuttle 40 by means of cap screws 42. These guide pins 41 serve to position the input arm and test arm assembly with respect to the input shuttle.

Figure 5:
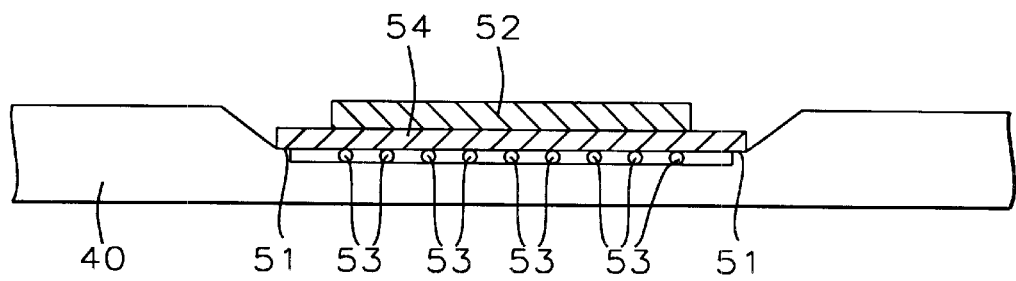
FIG. 5 shows a cross section of the first possible chambered shuttle pocket in the input shuttle plate.

FIG. 5 shows the first of the three possible pocket designs for the shuttle pockets. The three pocket designs can be referred to as input pockets since a BGA device is placed into or inputted into these pockets shown in FIGS. 5, 6 and 7. The input pocket that is shown in FIG. 7 further shows that this input pocket has a plurality of semi-circular holes 71. This design (FIG. 5) provides firm support for the device or semiconductor die 52 at points 51 by means of a support step 54. This design lends itself for device kits with large open space or tolerance around the periphery of the head of the pick up shaft, the design would therefore be suitable for a 27×27 BGA. The open space around the periphery of a 4×4 BGA is considerably more limited meaning that this design for the shuttle pocket is not suitable for smaller BGA devices. The sections marked as 52 and 54 form the BGA device, 54 is part of the BGA device, it forms a mechanical step that is meant and designed to rest on the socket edge 51. The ball bearings underneath the BGA device are indicated with 53. The BGA device construction shown in FIG. 5 is one type of BGA device that has step 54 as part of the device 52.

Figure 6:
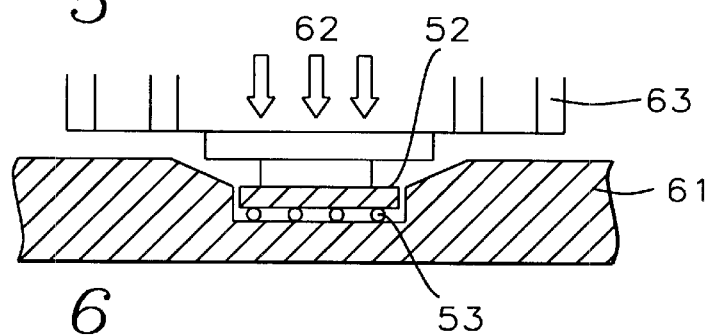
FIG. 6 shows a cross section of the second possible chambered shuttle pocket in the input shuttle plate.
Figure 7:
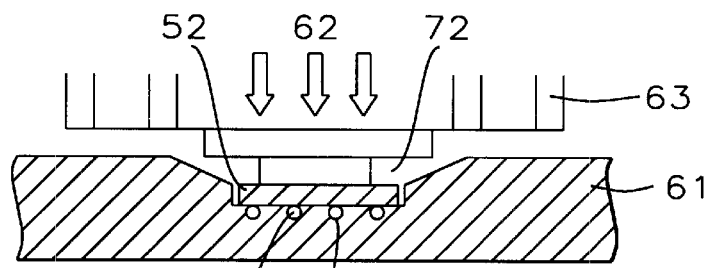
FIG. 7 shows a cross section of the third possible chambered shuttle pocket in the input shuttle plate.

FIG. 6 shows the second possible design for the shuttle pocket. For this design the device 52 is guided by the chamfered sides of the shuttle pocket, the device 52 and the bearings 53 are resting directly on the shuttle plate 61. The force 62 exerted by the input arm assembly 63 onto the shuttle plate 61 will therefore be directly transferred to the ball bearings 53 opening the possibility that the ball bearings 53 might be damaged or deformed. It is to be noted that the input arm assembly 63 consists, as shown in FIG. 6 (and FIG. 7 following), of three distinct levels of construct, in size decreasing toward the shuttle plate 61. These three constructs have not been further differentiated in this description since they all form part of the pick up shaft that protrudes through the bottom plate 19 (FIG. 3b).

FIG. 7 shows the third and last design within the scope of the present invention for the shuttle pocket. The input arm 63 is guided by the chamfered sides of the pocket. In addition, there are semi-circular holes 71 provided at the bottom of the shuttle opening 72 into which device balls 53 are resting. This design provides for an even distribution of the exerted force 62 which is now exerted on the device body 52 rather than on the ball bearings 53 as was the case in the preceding design (FIG. 6). This design has the added advantage of providing better heat dissemination to the bearings 53 under conditions of high temperature operation. Note that the device design 52 does not have the step 54 as previously (FIG. 5) shown to be part of the device design.

The chamfering feature of the head of the pick-up shaft is not highlighted in FIGS. 5, 6 and 7 because the test head is, for these applications, designed to be smaller than the matching device body package.

Figure 8A:
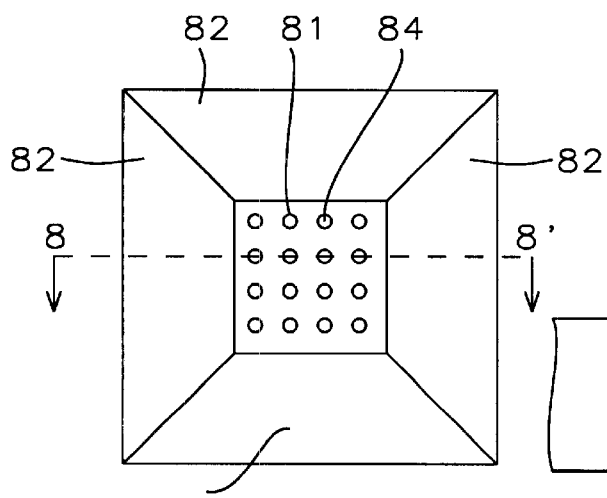
FIGS. 8a and 8b show top view of one of the pocket designs in the hot plate and the shuttles together with a cross section view of the positioning pocket for both of these applications.
Figure 8B:
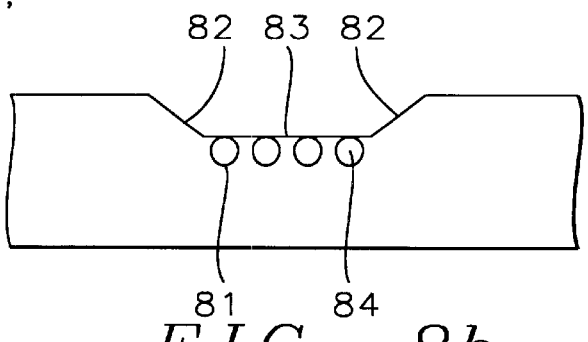

FIG. 8a shows a top view of the hot plate input shuttle or output shuttle pocket. FIG. 8b shows a cross sectional view of the hot plate input shuttle or output shuttle pocket. The previous comments made regarding the input shuttle apply to the hot plate and the output shuttle, that is no redesign of the hot plate and output shuttle is required within the scope of the present invention other than the pockets which can. be redesigned along the same pocket design approaches as shown in FIGS. 5 through 7. FIGS. 8a and 8b shows the implementation of the pocket design in accordance with the proposed method as per FIG. 7, that is the third of the possible three methods of pocket design. The pocket design as shown in FIGS. 8a and 8b is used for the input shuttle, the output shuttle and the hot plate. The BGA device is guided by the chamfered sides 82 of the pocket 83. In addition, there are semicircular holes 81 provided at the bottom of the shuttle pocket 83 into which device ball bearings will be resting. This design provides for an even distribution of the exerted force (not shown) which is now exerted on the device body rather than on the ball bearings. This design has the added advantage of providing better heat dissemination to the device bearings under conditions of high temperature operation. This design of the BGA device does not have a mechanical step 54 as was shown for the BGA device of FIG. 5

FIGS. 9a and 9b have previously been described under the description of the Prior Art.

Figure 10A:
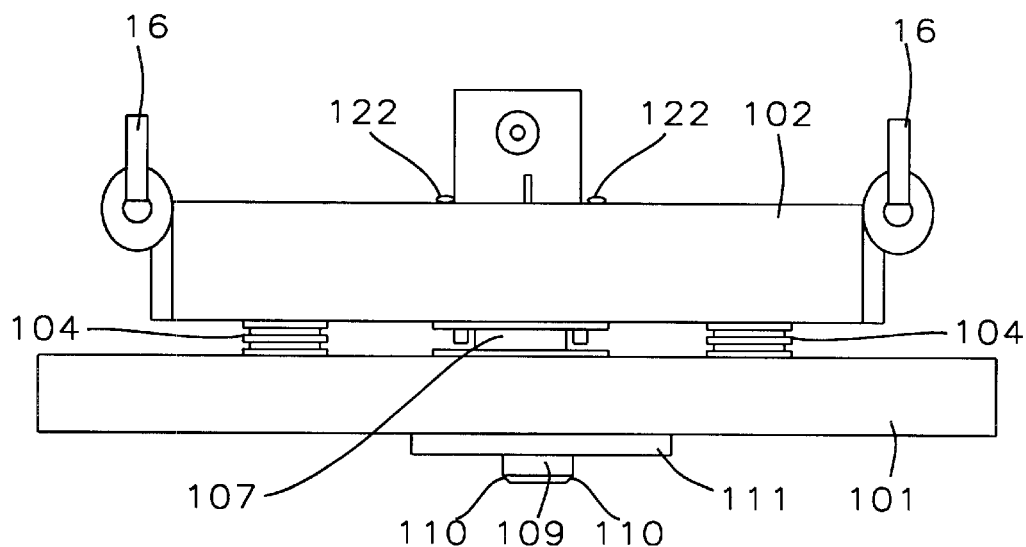
FIGS. 10a and 10b show the side view and a cross sectional view of the test arm assembly in accordance with the present invention.
Figure 10B:
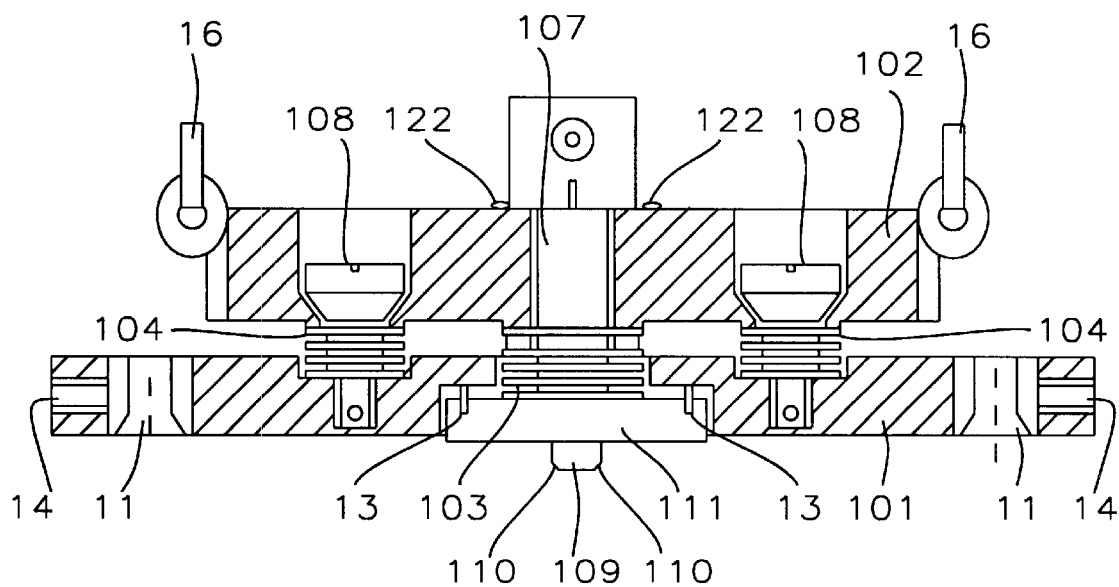

FIGS. 10a and 10b shows a side view and cross sectional view of the test arm assembly of the present invention. The pick up shaft 107 is at the center of the BGA device kit assembly. The lower or contact surface 109 of the head 111 of the pick up shaft 107 will enter a device pocket within the device test plate where the BGA device is to be positioned for BGA device testing. This entry into the test socket is facilitated by the chamfered sides 110 of the head 111 of the pick up shaft 107 and bottom plate 19 which guide the pick up shaft 107 to the desired position relative to the BGA device testing socket by meeting with the docking plate test guide pins 113. Further accuracy in positioning the test arm is required which is provided by the design of the BGA device test kit assembly of the present invention which provides for two plates, the top plate 102 and the bottom plate 101. Two guide openings or bushings 11 are provided for rough orientation of the BGA device test kit with respect to the test plate, set screws 14 secure or fix the bushings 11 of the lower plate 101 with respect to the test plate. A rubber 'O', ring is used to prevent leakage around the pick up shaft 107 in the upper plate 102. The top plate 102 is held together with the bottom guiding plate 101 by means of four specially designed guide pins 108. These screws are tapered at the top head for less friction between the top plate 102 and the specially designed guide pins 108 during compression and retraction of the assembly during and after testing respectively.

Around each guide pin 108 there is a spring 104 of correct tension, a total of four springs, one spring on each side. The spring 104 provides the compression force from top plate 102 which comes into play once the bottom plate 101 has been positioned relative to the target plate or shuttle. In addition it prevents excessive torque on the handler test arm. The center spring 107 provides the refracting force for the pick up shaft 107 ensuring that the pick up shaft is always in the correct position and level for picking up devices from the shuttle. The guide pins 108 therefore have the dual purpose of positioning the bottom plate 101 with respect to the top plate 102 and of holding compression springs 104 in place. The test kit of the present invention is provided with two guide pins 108 which results in more accurate and dependable positioning of the BGA device kit. The pick up shaft 107 with spring 103 in conjunction with the four springs 104, each spring of the correct tension, provide a solid force which forces the device under test into the test or target socket while at the same time preventing any unnecessary force on the test arm. From the above it is clear that the pick up shaft 107 of the test arm can move in a direction which is perpendicular to its axis and, in doing so, find its optimum or ideal position with respect to the test socket. Clip holders 16 allow for manual handling of the test device kit. Shaft guide pins 13 are provided to assure that the pick up shaft remains in a position which is perpendicular to bottom plate 101.

The BGA device (not shown) is picked up and held against the bottom 109 of the head 111 of the pick up shaft 107 of the BGA device kit by means of vacuum suck provided via a vacuum opening (not shown) running through the center of the pick up shaft.

Plates 102 and 101 of the test kit are joined together by means of a specially designed screws with guide pin 108 which have threaded ends that screw to the top plate 102.

It is apparent form the above description that the design of the test arm assembly is considerably more complex than the design of the input arm. This increased complexity in the design of the test arm is dictated by the fact that the test arm is subjected to considerable force and friction during its operation while the input arm merely moves and positions devices.

Figure 11A:
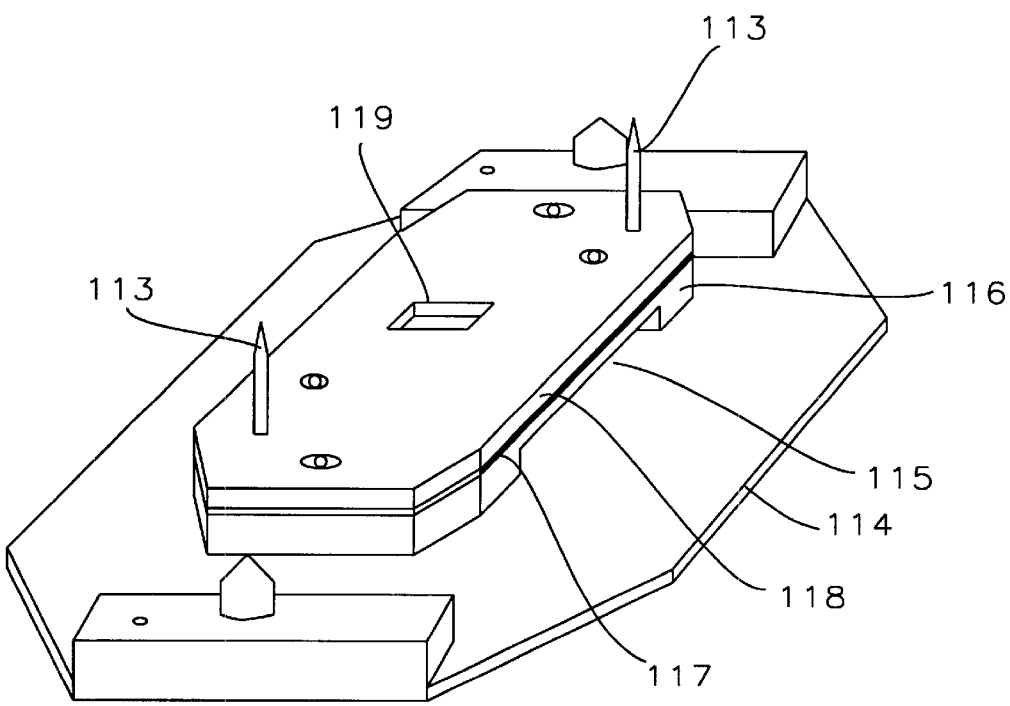
FIGS. 11a through 11d show an exploded perspective view of the docking plate (FIG. 11a) together with a plan view of the docking plate chamfer guide (FIG. 11b), the cross section view of the docking plate (FIG. 11c) and the cross section view of the docking plate with a pocket (FIG. 11d).
Figure 11B:
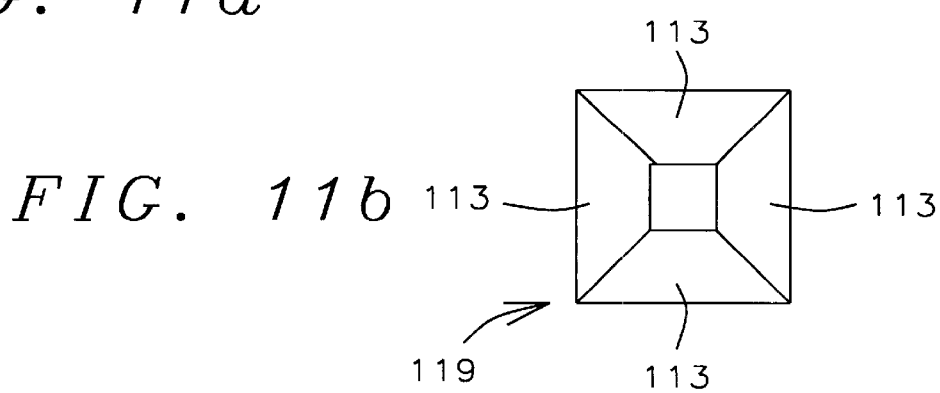
Figure 11C:
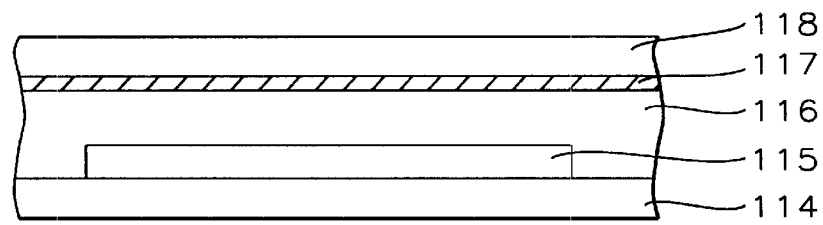
Figure 11D:
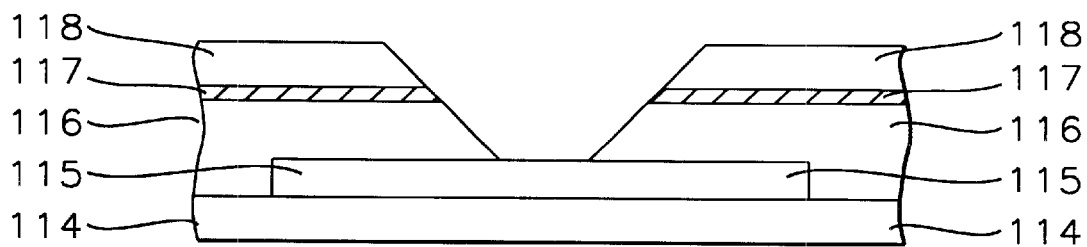

FIG. 11a shows an exploded perspective view of the docking plate with support plate 114, bottom guide plate 116, cut out 115, shim 117 for height control, top guide plate 118, pocket opening 119 and guide pins 113 for orientation of the BGA device kit with respect to the docking plate 114. FIG. 11b shows the plan view of the top of the docking plate with chamfered edges 113. FIG. 11c shows a cross sectional view of the docking plate in the area of the socket 115. Depending on the type of socket being used, as highlighted in FIGS. 5 through 7, minor modifications may be required to the docking top and bottom guide plates 116 and 118 resp., FIG. 11c. The opening in shim 117 may also have to be adjusted. Height control of the docking plate is readily provided by means of adding or deleting shims not shown in FIGS. 11a through 11c to raise or lower the top of the docking plate. The guide plates 116 and 118 are also chamfered towards the center of the socket providing the proper insertion of the BGA device kit and into the socket site.

Figure 12A:
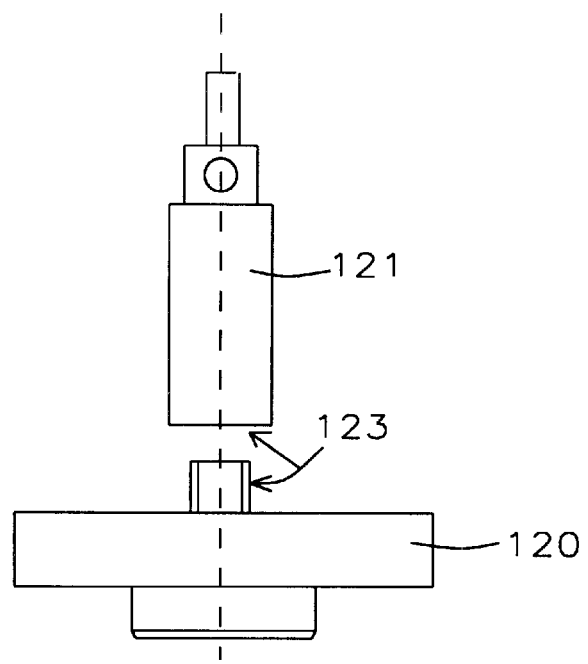
FIGS. 12a and 12b show the modifications required to the pick-up shaft, both in side view (FIG. 12a) and in cross sectional view (FIG. 12b) to enhance pick-up flexibility.
Figure 12B:
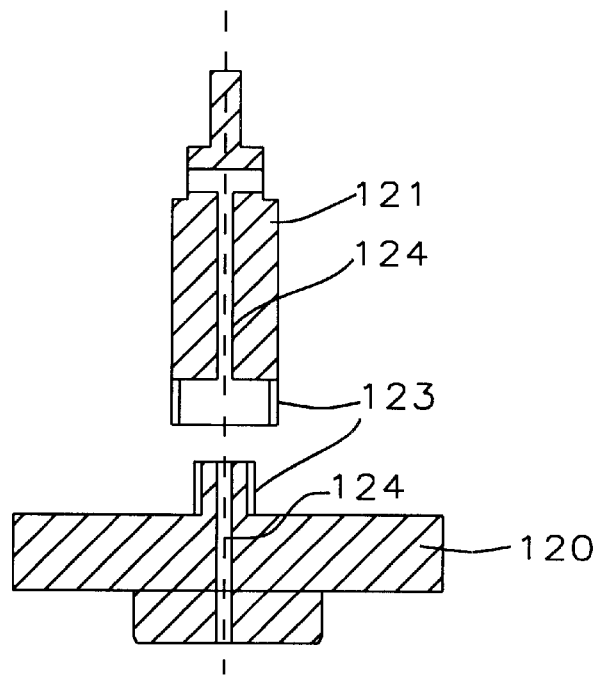

FIGS. 12a and 12b modifications to the pick up head, in side view (FIG. 12a) and a cross section (FIG. 12b). It is the objective of the present invention to make the pick up head readily interchangeable, that is to remove the head assembly 120 from the pick up shaft 121. This so that different types and. sizes of pick up heads 120 can be quickly mounted for high throughput objectives. By providing a threaded part 123 between the pick up head 120 and the pick up shaft 121 this objective can be implemented. A vacuum suck 124, FIG. 12b, is provided to pick up the BGA devices.

Figure 13A:
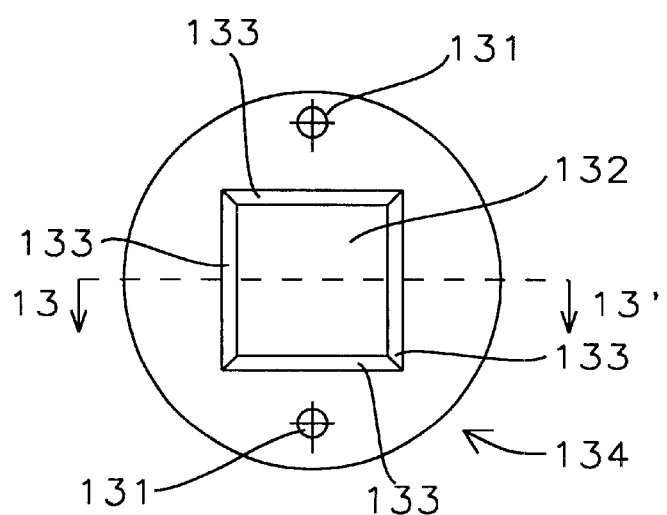
FIGS. 13a through 13c show bottom view (FIG. 13a) with side view (FIG. 13b) and cross sectional view (FIG. 13c) of one version of the pick-up shaft head. This version uses one plane or surface of the shaft head for entry into the chamfered shuttle opening (or device pocket).
Figure 13B:
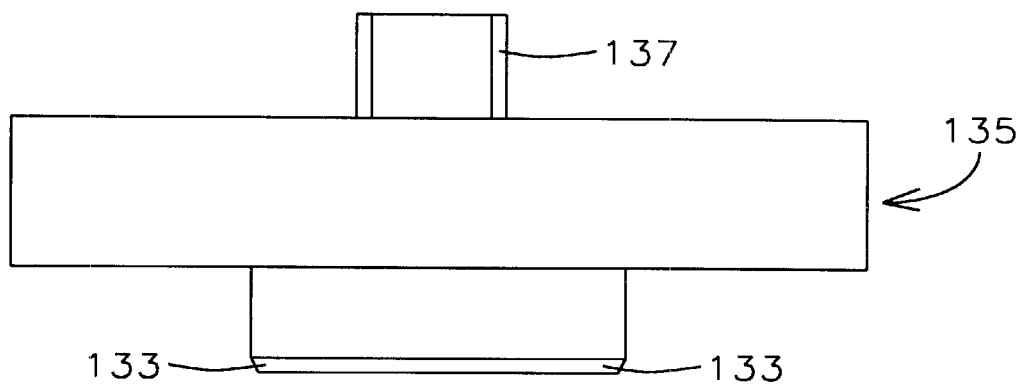
Figure 13C:
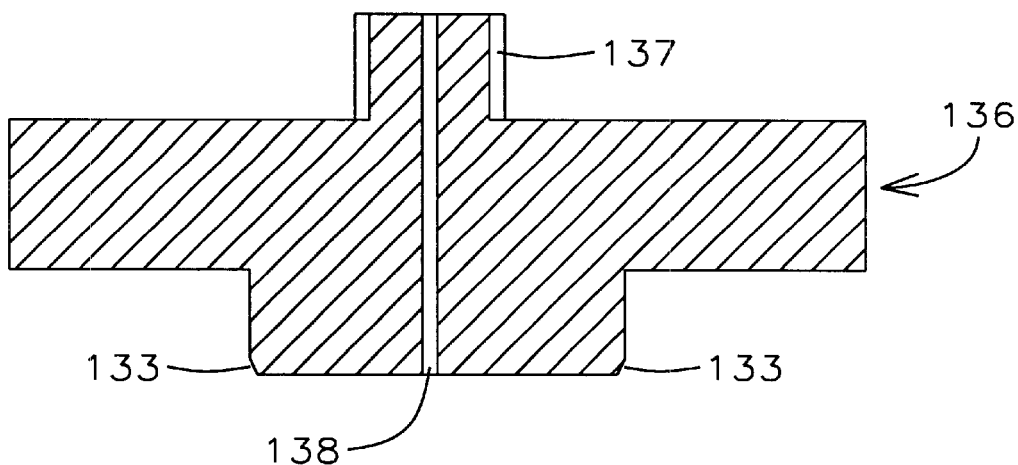

FIGS. 13a through 13c further detail a single contact-surface pick up head with a bottom plan view 134 (FIG. 13a), a side view 135 (FIG. 13b) and a cross sectional view 136 (FIG. 13c). Thread. 137 is provided for quick interchange of the pick up head 135. Shaft guide holes 131 are provided to guide the positioning of the BGA device kit with respect to the target plate or shuttle. Vacuum suck opening 138 provides for BGA device pick up. The chamfered sides 133 of socket 132 provide easy entrance to the target plate pocket and socket.

Figure 14A:
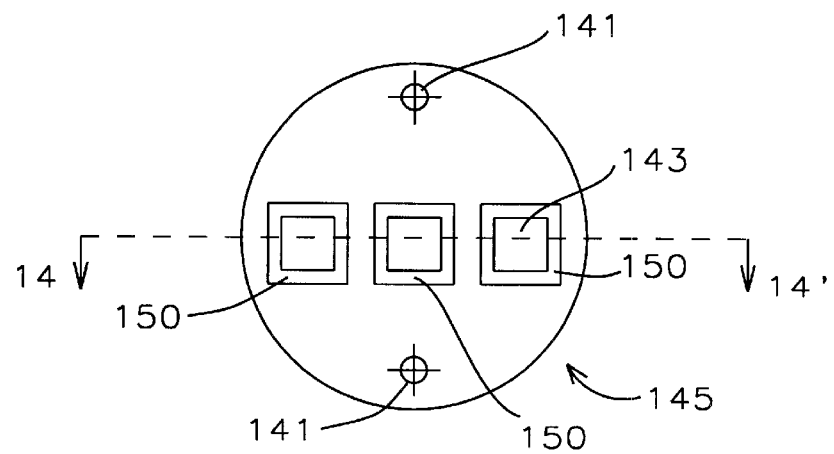
FIGS. 14a through 14c show the second version of the pick-up shaft head in bottom view (FIG. 14a), in side view (FIG. 14b) and in cross section view (FIG. 14c). This version is constructed using three planes or surfaces of the shaft head for entry into chamfered shuttle openings.
Figure 14B:
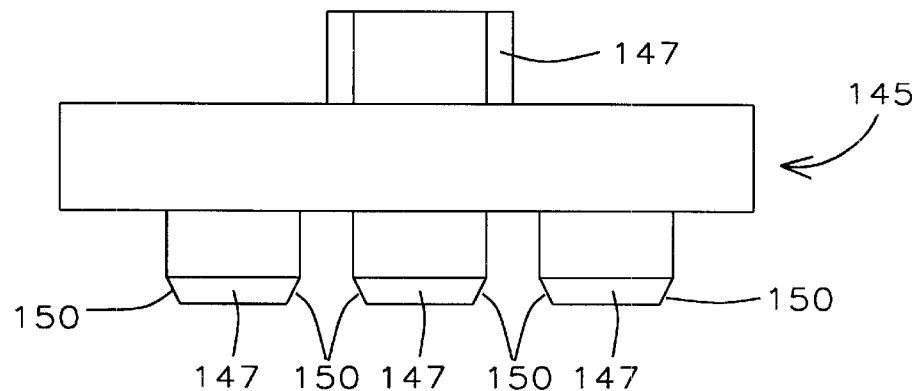
Figure 14C:
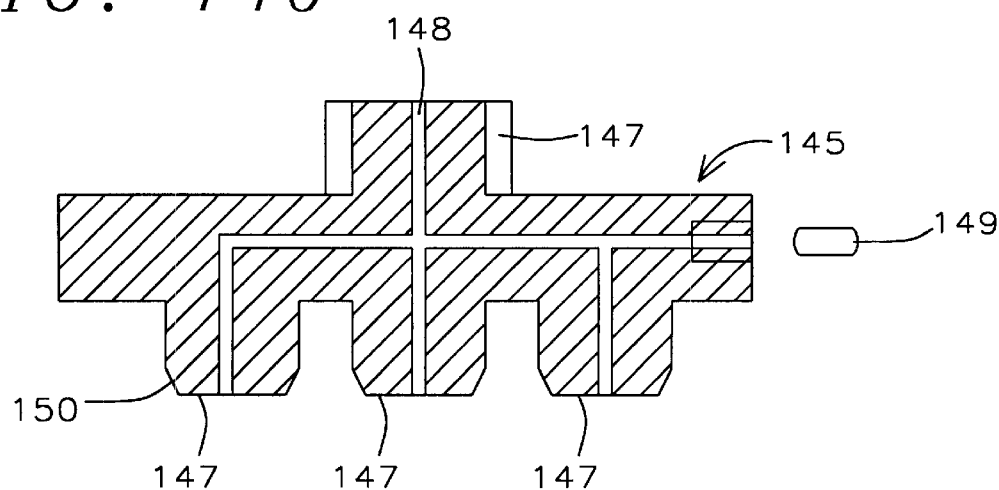

FIGS. 14a through 14c further detail a triple contact-surface pick up head with a bottom plan view (FIG. 14a), a side view (FIG. 14b and a cross sectional view (FIG. 14c). Thread 147 is provided. for quick interchange of the pick up head. Shaft guide holes 141, FIG. 14a, are provided to guide the positioning of the head 145 of the pick up shaft and with it the pick up shaft with respect to the target plate or shuttle. Vacuum suck opening 148 provides for BGA device pick up. The chamfered sides 150 of pockets 142 provide easy entrance between the pick up head and the target plate or shuttle. The set screws 149 do not vary the vacuum suck pressure and are meant for readily forming the vacuum path that links the three head contact surface 147 with the main vacuum suck opening 148. This triple head contact surface 147, FIG. 14c, allows increased flexibility in the number of devices which can be handled, that is from the one contact-surface device pick up head shown in FIG. 13 to the three contact-surface pick up head shown in FIG. 14.

Figure 15:
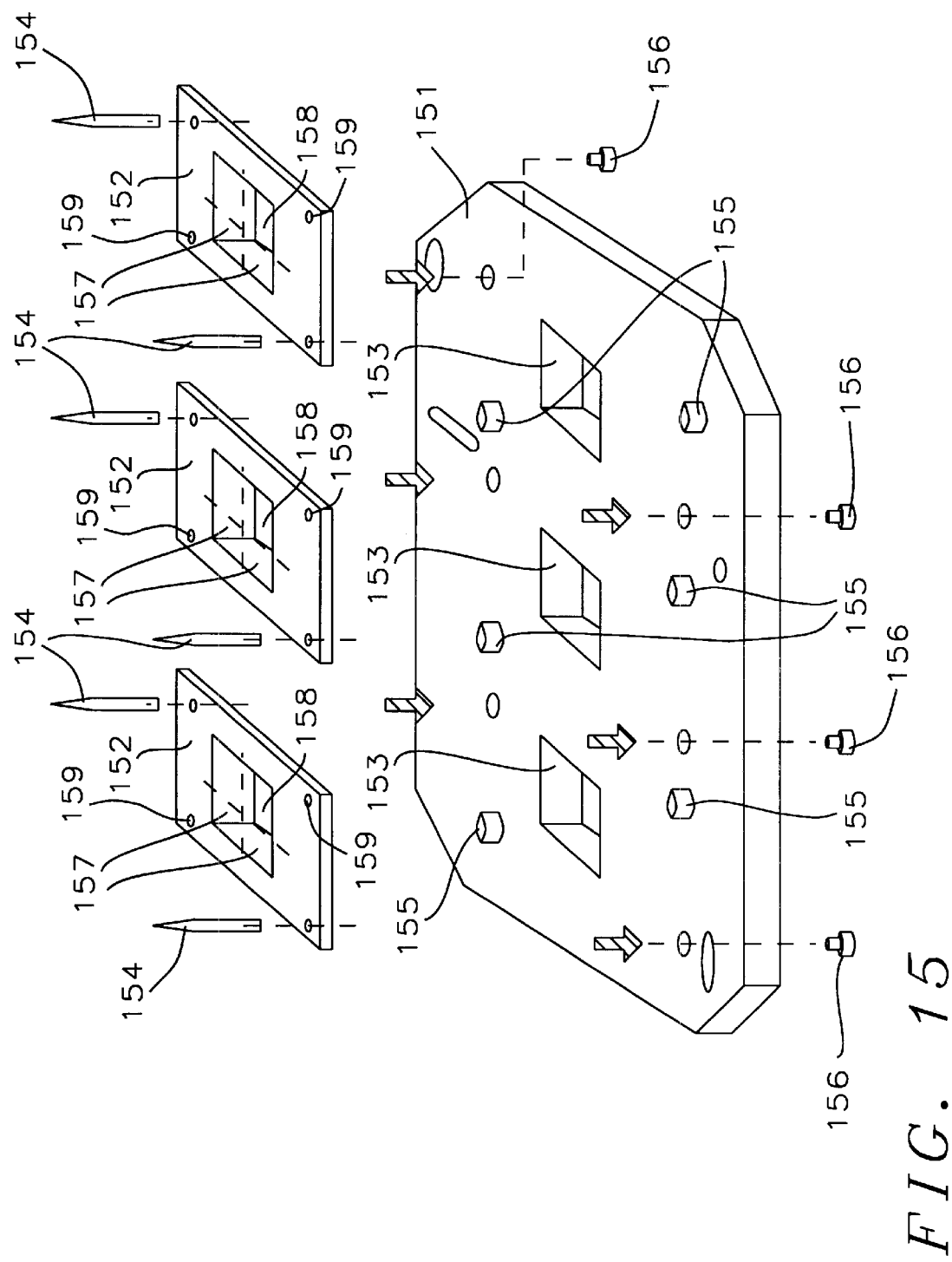
FIGS. 15 show the a shuttle plate with three device pockets.

FIG. 15 shows a shuttle plate 151 with three pocket adaptors 152. The shuttle pockets 153 are, within the scope of the present invention, enlarged from the Prior Art pockets. Different shuttle pocket adaptors 152 will be fabricated with the inside or pocket dimensions of each pocket adaptor 152 corresponding to a particular BGA device size. The pocket adaptors 152 can be quickly interchanged and attached to the shuttle plate 151 dependent on and in accordance with the size and type of the BGA device which is being processed. Guide pins 154 serve for the initial alignment of the pocket adaptors 152 and alignment to the vacuum path and test arm assembly, cap screws 155 further position the pocket adaptors 152 with respect to the shuttle plate 151. Guide pins 154 are attached to the shuttle plate 151 by means of the guide pin screws 156. The edges or sides of the pockets within the pocket adaptors are chamfered for ease of entry of the device into the pocket. This design modification within the scope of the present invention greatly enhances the type of devices which can be handled by the pick up head and the speed by which these devices are handled.

Figure 16A:
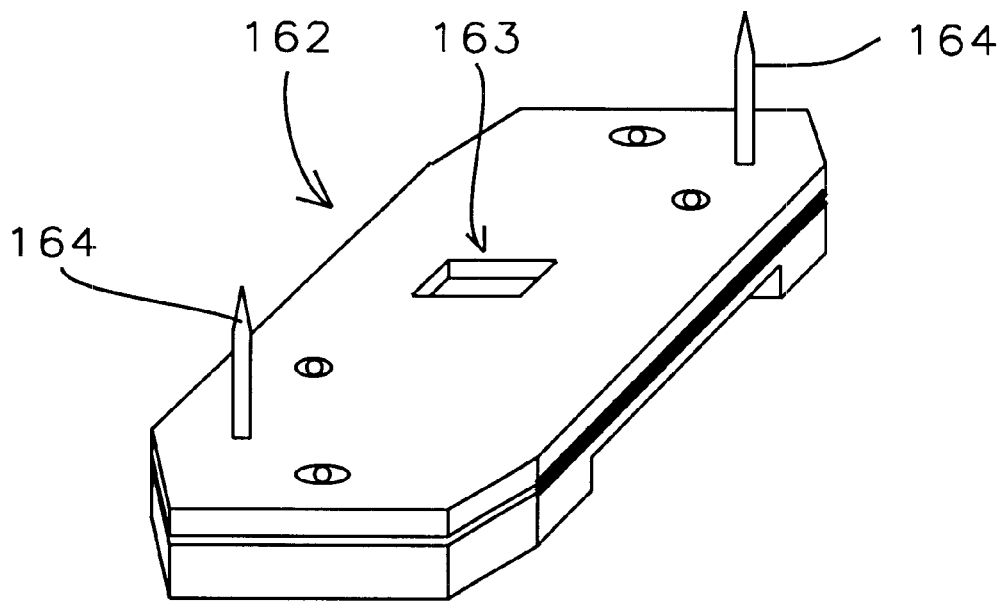
FIGS. 16a and 16b show an exploded perspective view of a docking plate.
Figure 16B:
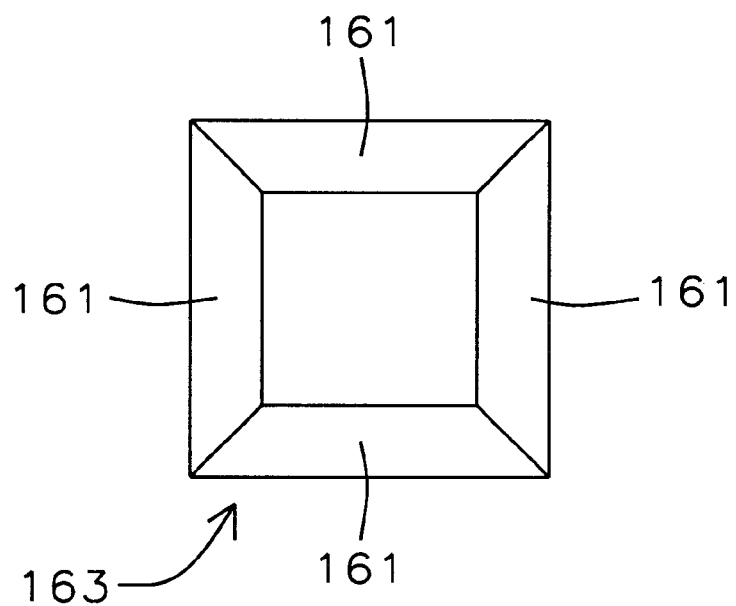

FIGS. 16a through 16b show an exploded perspective view of the docking plate, FIG. 16a, together with a plan view of the modification required to adapt the top plate of the docking plate to accommodate the changes to the device package, FIG. 16b. The chamfered sides 161 of the pocket 163 are modified as indicated by 162, the width, angle and depth of the chamfering is adjusted according to the size of the semiconductor to be handled by the docking plate. Guide pins 164 are provided for alignment between the BGA device kit and the target docking plate.

Figure 17A:
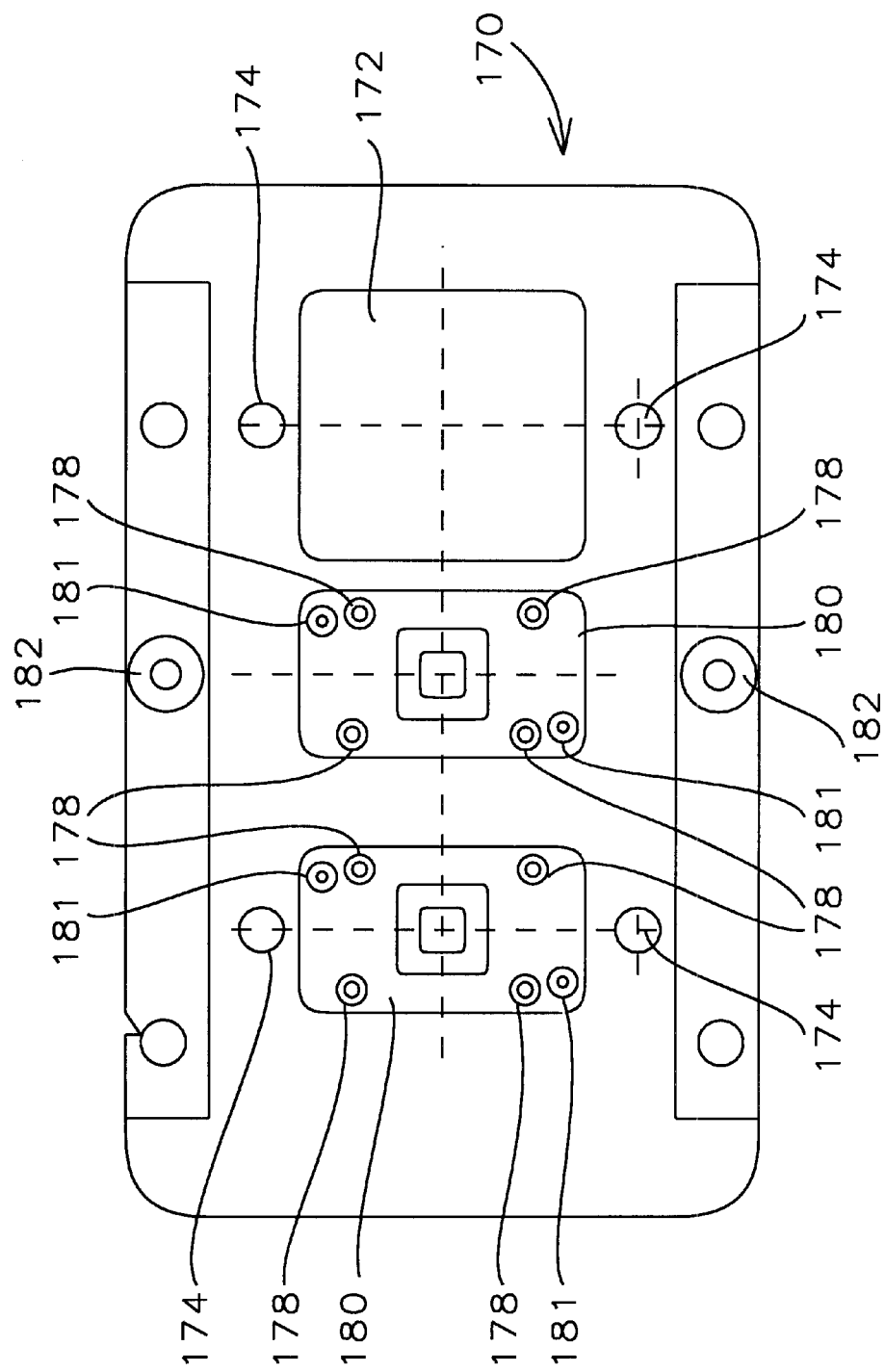
FIGS. 17a through 17d show details of a docking plate design, that is

FIG. 17a shows a specially designed docking plate that makes use of the testing kit of the present invention. The docking plate 170 has an opening 172 of a design to fit and accept the test socket of the present invention. The docking plate 170 is mounted as a separate unit into the load board by means of four load board guide pins 174 and guided into the handler by two docking guide pins 182. Adjacent to the test socket of the present invention are provided. two openings 180 into which devices can be temporarily retained, these openings therefore form device buffers. These device buffer areas 180 are readily changed and adapted to serve as buffer areas for other BGA device packages. Cap screws 178 affix the BGA device within the two buffer openings 180. Insulation underneath the docking plate assures that no electrical shorts occur between the docking plate and the load board.

Figure 17B:
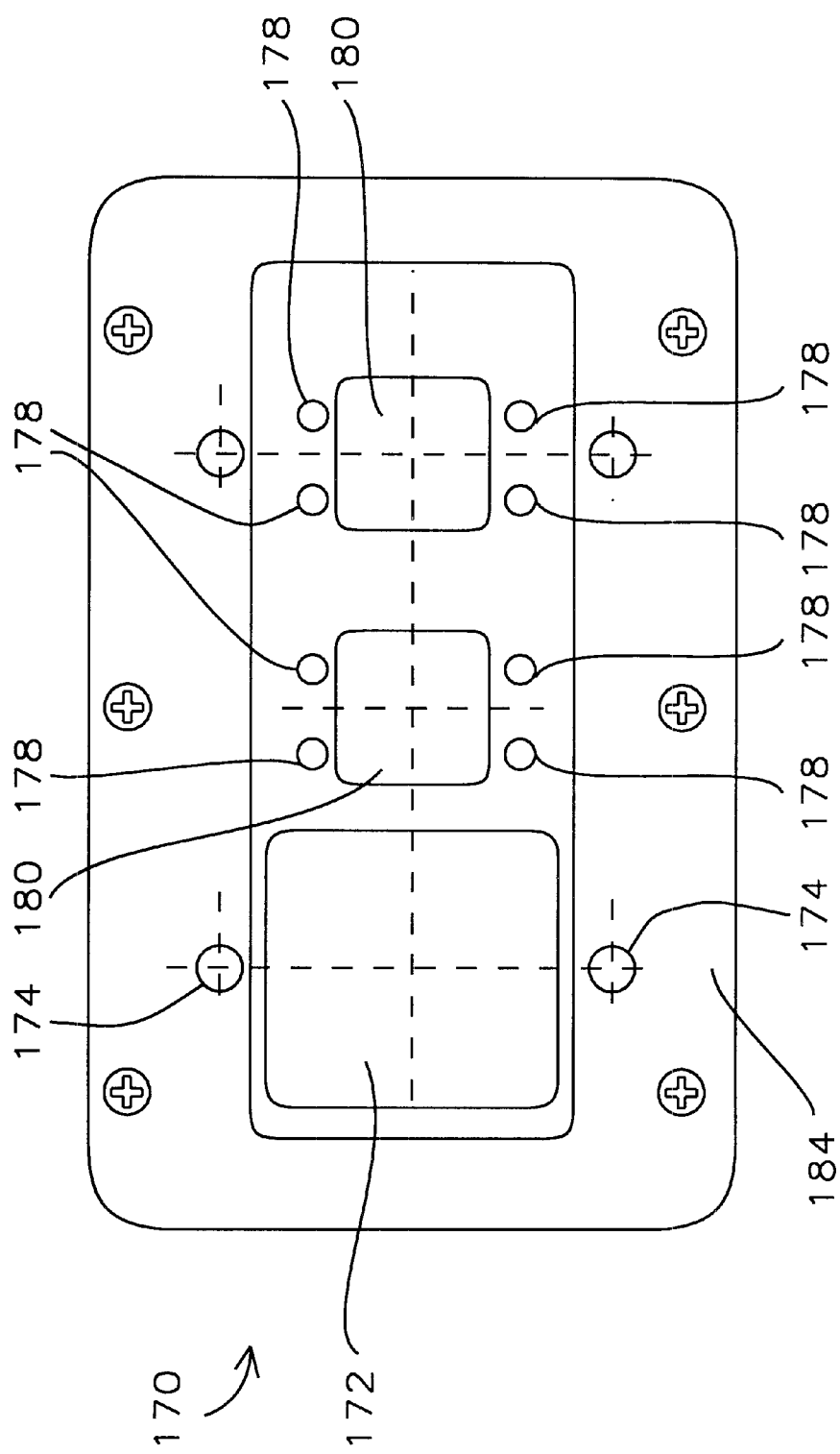

FIG. 17b shows a back or rear view of the docking plate described above under FIG. 17a. Insulation 184 assures that no electrical shorts occur between the docking plate and the load board. The cap screws 178 as also shown in FIG. 17b.

Figure 17C:
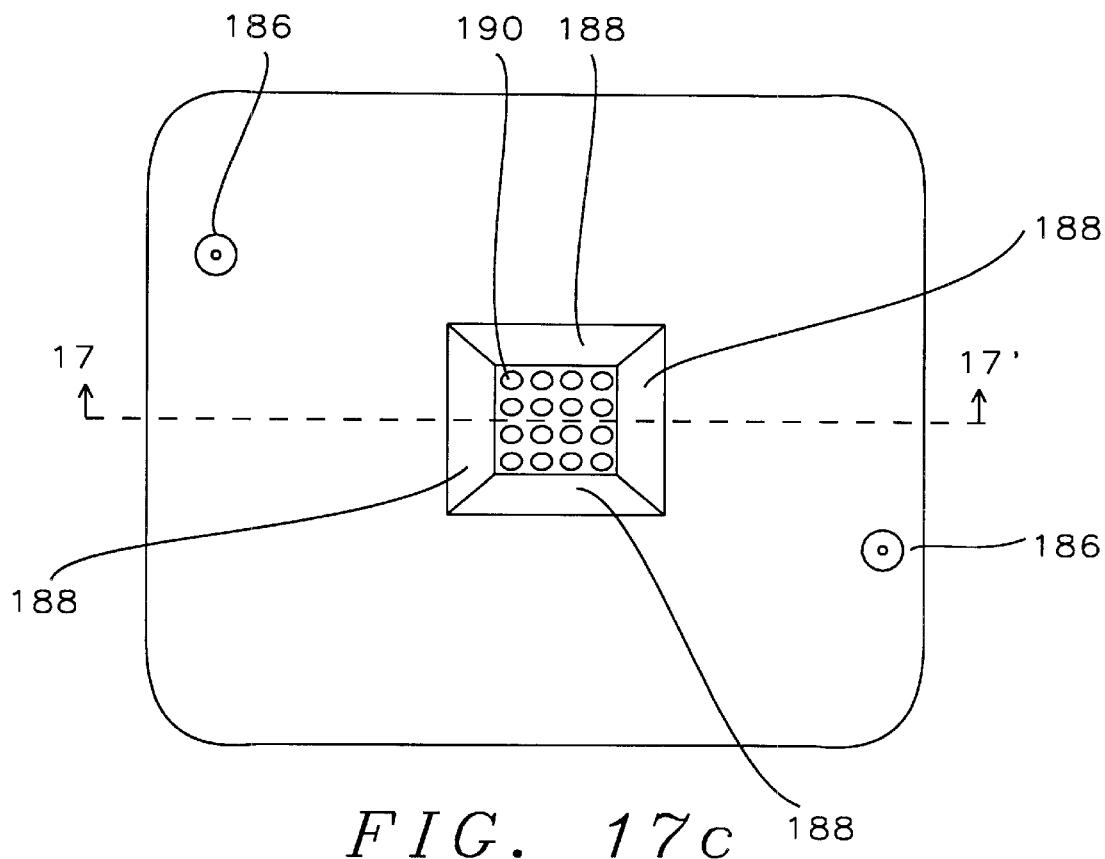

FIG. 17c shows a design for the docking plate whereby the BGA device is guided into the docking plate by means of the four chamfered sides 188 of the socket within the docking plate. The chamfered angle of the four sides 188 of the socket is approximately 30 degrees. Two guide pins 186 are provide that guide the socket into position within the work press assembly. Contact elements 190 are provided at the base of the BGA device socket, these are electrical pins that come into contact with the BGA device ball bearings. The socket body will serve as the mechanical hard stop to prevent any over travel by the work press assembly.

Figure 17D:
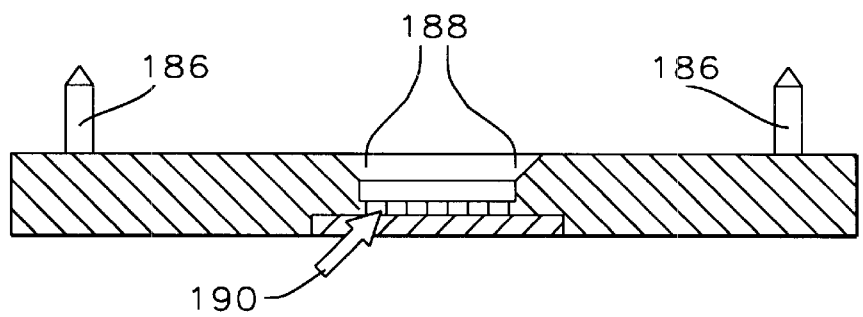

FIG. 17d shows the cross section along the line 17–17' of the socket that has been described under FIG. 17c.

The present invention as described in detail above provides for a customized and flexible device kit for semiconductor Ball Grid Array applications. Detailed dimensions for the specific items of hardware required which have been detailed above are readily determined and are easily adapted to specific BGA applications. The present invention also greatly extends the tolerance of alignment of the device within the BGA thus making BGA applications better suited for future demands of increasing throughput and decreasing device cost.

The described pick up arms with the concomitant plates and shuttles have been shown in exemplary embodiments which is not to negate that other configurations are possible to provide the required electrical connections between the semiconductor device and the socket. For example, the number of sockets per shuttle plate can be changed. Whereas the invention is intended to encompass the foregoing preferred embodiments as well as a reasonable range of equivalents, reference should be made to the appended claims rather to the foregoing discussion of examples, in order to access the scope of the invention in which exclusive rights are claimed.

What is claimed is:

1. A method for transporting a ball grid array semiconductor device into a semiconductor manufacturing work station comprising the steps of:

providing a semiconductor device having a semiconductor device mounting support with a periphery, a plurality of conductive vias formed in the semiconductor device mounting support, a semiconductor die mounted on the semiconductor device mounting support and electrically coupled to the plurality of conductive vias, a plurality of conductive balls attached to the semiconductor device mounting support and electrically coupled to the semiconductor die through the plurality of conductive vias;

providing an input pocket for receiving the semiconductor device and having a plurality of semi-circular holes, thereby providing a first enabling for transporting said ball grid array semiconductor device into a semiconductor manufacturing work station; and placing the semiconductor device in the input pocket such that the plurality of semi-circular holes of the input pocket is providing proper positioning to the plurality of conductive balls that is attached to the semiconductor device mounting support, thereby providing a second and final enabling for transporting said ball grid array semiconductor device into a semiconductor manufacturing work station.

2. The method of claim 1 and further comprising biasing the semiconductor device using the plurality of semi-circular holes to send pressure to the semiconductor die.

3. The method of claim 2 wherein said biasing is performed at a temperature above the ambient temperature.

4. The method of claim 2 wherein said biasing comprises burn-in of the semiconductor device.

5. The method of claim 4 wherein the step of biasing the semiconductor device comprises burning-in of the semiconductor.

\* \* \* \* \*